United States Patent
Maute et al.

(10) Patent No.: US 10,355,174 B2
(45) Date of Patent: Jul. 16, 2019

(54) COMPONENT HAVING IMPROVED COUPLING-OUT PROPERTIES

(71) Applicant: OSRAM Opto Semiconductors GmbH, Regensburg (DE)

(72) Inventors: Markus Maute, Alteglofsheim (DE); Lutz Höppel, Alteglofsheim (DE); Jürgen Moosburger, Lappersdorf (DE); Thomas Schwarz, Regensburg (DE); Matthias Sabathil, Regensburg (DE); Ralph Wirth, Lappersdorf (DE); Alexander Linkov, Regensburg (DE); Johannes Baur, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 6 days.

(21) Appl. No.: 15/738,427

(22) PCT Filed: Jul. 12, 2016

(86) PCT No.: PCT/EP2016/066525
§ 371 (c)(1),
(2) Date: Dec. 20, 2017

(87) PCT Pub. No.: WO2017/009331
PCT Pub. Date: Jan. 19, 2017

(65) Prior Publication Data
US 2018/0182926 A1    Jun. 28, 2018

(30) Foreign Application Priority Data

Jul. 15, 2015 (DE) .......... 10 2015 111 493

(51) Int. Cl.
*H01L 33/20* (2010.01)
*H01L 33/24* (2010.01)
(Continued)

(52) U.S. Cl.
CPC .............. *H01L 33/46* (2013.01); *H01L 33/20* (2013.01); *H01L 33/24* (2013.01); *H01L 33/382* (2013.01);
(Continued)

(58) Field of Classification Search
CPC ..... H01L 33/20; H01L 33/38; H01L 33/0079; H01L 33/382; H01L 33/22; H01L 33/405;
(Continued)

(56) References Cited

U.S. PATENT DOCUMENTS 7,023,020 B2 *  4/2006  Uemura .................. H01L 33/20
                                                    257/79
7,358,544 B2 *  4/2008  Sakamoto ............... H01L 33/20
                                                    257/103
(Continued)

FOREIGN PATENT DOCUMENTS

DE    10 2008 048 648 A1    4/2010
DE    10 2010 032 497 A1    2/2012
(Continued)

*Primary Examiner* — Zandra V Smith
*Assistant Examiner* — Jeremy J Joy
(74) *Attorney, Agent, or Firm* — DLA Piper LLP (US)

(57) ABSTRACT

A component includes a carrier and a semiconductor body arranged on the carrier, wherein the semiconductor body has an active layer arranged between the first and second semiconductor layers and is configured to generate, during operation of the component, an electromagnetic radiation that can be coupled out from the component through a first main surface, the first main surface of the component has an electrical contact layer configured to electrically contact a first semiconductor layer and in a plan view the carrier covers the first main surface in places, and in direct vicinity of the electrical contact layer the component includes a (Continued)

shielding structure configured to prevent electromagnetic radiation generated by the active layer from impinging onto the contact layer.

17 Claims, 4 Drawing Sheets (51) Int. Cl.
H01L 33/30 (2010.01)
H01L 33/38 (2010.01)
H01L 33/40 (2010.01)
H01L 33/46 (2010.01)
H01L 33/60 (2010.01)
H01L 33/62 (2010.01)

(52) U.S. Cl.
CPC ............ H01L 33/385 (2013.01); H01L 33/60 (2013.01); H01L 33/62 (2013.01); *H01L 33/30* (2013.01); *H01L 33/405* (2013.01); *H01L 2933/0083* (2013.01); *H01L 2933/0091* (2013.01)

(58) Field of Classification Search
CPC ....... H01L 33/46; H01L 33/44; H01L 33/387; H01L 33/60; H01L 2933/0083
See application file for complete search history.

(56) References Cited

U.S. PATENT DOCUMENTS

| 7,732,822 B2* | 6/2010 | Kim ................... H01L 33/08 257/79 |
| 7,816,695 B2* | 10/2010 | Lin ................... H01L 27/153 257/103 |
| 8,405,101 B2* | 3/2013 | Lee ................... H01L 33/20 257/94 |
| 2003/0222269 A1* | 12/2003 | Lin ................... H01L 33/145 257/99 |
| 2004/0089861 A1* | 5/2004 | Chen ................... H01L 33/145 257/11 |
| 2004/0089869 A1* | 5/2004 | Uemura ................... H01L 33/22 257/85 |
| 2004/0124428 A1* | 7/2004 | Lin ................... H01L 33/0079 257/90 |
| 2005/0056855 A1* | 3/2005 | Lin ................... H01L 33/382 257/98 |
| 2006/0108593 A1* | 5/2006 | Kim ................... H01L 33/46 257/94 |
| 2008/0230791 A1* | 9/2008 | Lin ................... H01L 33/382 257/91 |
| 2009/0179211 A1* | 7/2009 | Yoo ................... H01L 33/20 257/98 |
| 2011/0042680 A1* | 2/2011 | Akaike ................. H01L 33/145 257/76 |
| 2011/0062487 A1* | 3/2011 | Oh ................... H01L 33/38 257/99 |
| 2011/0114980 A1* | 5/2011 | Lee ................... H01L 33/10 257/98 |
| 2011/0227120 A1* | 9/2011 | Yang ................... H01L 33/20 257/98 |
| 2012/0018757 A1* | 1/2012 | Jeong ................... H01L 33/38 257/98 |
| 2014/0217460 A1* | 8/2014 | Tangring ............... H01L 33/145 257/99 |

FOREIGN PATENT DOCUMENTS

| DE | 10 2011 111 919 A1 | 2/2013 | |
| EP | 2 280 431 A2 | 2/2011 | |
| EP | 2 410 583 A2 | 1/2012 | |
| JP | 2004-047504 A | 2/2004 | |
| WO | 2007/008047 A1 | 1/2007 | |
| WO | WO-2013029847 A1 * | 3/2013 | ........... H01L 33/145 |

* cited by examiner

COMPONENT HAVING IMPROVED COUPLING-OUT PROPERTIES

TECHNICAL FIELD

This disclosures relates to a component having improved coupling-out properties.

BACKGROUND

Light generated in a semiconductor body of a component may be reflected multiple times within the semiconductor body before it is coupled out of the component. In the course of multiple reflections, light will be absorbed and get lost if it impinges on absorbing layers such as metal contacts.

It could therefore be helpful to provide a highly efficient component having improved coupling-out properties.

SUMMARY

We provide a component including a carrier and a semiconductor body arranged on the carrier, wherein the semiconductor body has a first main surface remote from the carrier and a second main surface facing the carrier, and the semiconductor body has a first semiconductor layer on the side of the first main surface and a second semiconductor layer on the side of the second main surface, the semiconductor body has an active layer arranged between the first and the second semiconductor layers and configured to generate, during operation of the component, an electromagnetic radiation that can be coupled out from the component through the first main surface, on the first main surface the component has an electrical contact layer configured to electrically contact the first semiconductor layer and in a plan view of the carrier covers the first main surface in places, and in direct vicinity of the electrical contact layer the component includes a shielding structure configured to prevent the electromagnetic radiation generated by the active layer from impinging onto the contact layer.

We also provide a component including a carrier, a semiconductor body arranged on the carrier and a mirror layer, wherein the semiconductor body has a first main surface remote from the carrier and a second main surface facing the carrier, and the semiconductor body has a first semiconductor layer on the side of the first main surface and a second semiconductor layer on the side of the second main surface, the semiconductor body has an active layer arranged between the first and the second semiconductor layers and is configured to generate, during operation of the component, an electromagnetic radiation that can be coupled out from the component through the first main surface, on the first main surface the component has an electrical contact layer configured to electrically contact the first semiconductor layer and in a plan view of the carrier covers the first main surface in places, in a direct vicinity of the electrical contact layer the component includes a shielding structure configured to prevent the electromagnetic radiation generated by the active layer from impinging onto the contact layer, the mirror layer is arranged in a vertical direction between the semiconductor body and the carrier, and in a plan view of the carrier from the first main surface, the shielding structure is arranged in a lateral direction between the electrical contact layer and the mirror layer, and in a plan view of the carrier, the mirror layer and the electrical contact layer are free of an overlap.

LIST OF REFERENCE NUMERALS

100 component
101 radiation exit surface
102 rear side of the component
1 carrier
2 semiconductor body
201 first main surface of the semiconductor body
202 second main surface of the semiconductor body
203 first surface of the step
204 second surface of the step
21 first semiconductor layer
22 second semiconductor layer
23 active layer
4 shielding structure
41 opening
43 reflector layer/reflecting layer
6 first contact
60 main body of the first contact
61 contact layer of the first contact
63 deep-laid contact layer of the first contact
7 further contact/second contact
72 mirror layer/further contact layer

DETAILED DESCRIPTION

Our component may have a carrier and a semiconductor body arranged on the carrier. The semiconductor body has a first main surface remote from the carrier and a second main surface facing the carrier. The semiconductor body can have a first semiconductor layer of a first charge carrier type on the side of the first main surface and a second semiconductor layer of a second charge carrier type on the side of the second main surface. Furthermore, the semiconductor body can comprise an active layer arranged in particular between the first and the second semiconductor layers. In particular, the active layer is a pn-junction zone. The active layer can be formed as one layer or as a layer sequence of a plurality of layers. During operation of the component, the active layer may emit electromagnetic radiation, for example, in the visible, ultraviolet or infrared spectral range. The component is, for example, a light-emitting diode (LED).

The first main surface of the semiconductor body is, for example, a radiation passage area of the component. This means that the emitted radiation passes, for example, through the first main surface before it is coupled out of the component. The radiation passage area is preferably structured, as a result of which the efficiency of the component with regard to the coupling-out of radiation is enhanced. In this case, a radiation exit surface of the component can be the radiation passage area or a surface of a further layer being arranged on the first main surface of the semiconductor body. In particular, the first main surface of the semiconductor body is formed by a surface of the first semiconductor layer. The second main surface of the semiconductor body can be formed by a surface of the second semiconductor layer. In particular, the first main surface and the second main surface delimit the semiconductor body in a vertical direction.

A vertical direction is understood to mean a direction which is transverse, in particular perpendicular to a main extension area of the active layer. For example, the vertical direction is perpendicular to the first and/or the second main surface of the semiconductor body. The vertical direction is in particular directed parallel to a growth direction of the semiconductor body. A lateral direction is understood to be a direction which extends parallel to the main area of extension of the active layer.

An electrical contact layer may be arranged on the first main surface of the semiconductor body, wherein the electrical contact layer is configured in particular to electrically contact the first semiconductor layer of the semiconductor body. Via the electrical contact layer, the first semiconductor layer can be electrically connected, for example, to an external voltage source. In a plan view of the carrier, the electrical contact layer covers the first main surface and thus the semiconductor body, for example, in places. The electrical contact layer can be formed as a first contact or as part of a first contact of the component to electrically contact the semiconductor body.

The component can have a further contact electrically contact the semiconductor body, for example, electrically contact the second semiconductor layer. The further contact can have a further contact layer arranged, for example, between the semiconductor body and the carrier. The carrier can be formed to be electrically conductive. It is possible for the carrier to have for instance an electrically insulating mold body and at least one electrical connection layer, wherein the electrical connection layer is arranged, for example, laterally of the semiconductor body and electrically conductively connects to the second semiconductor layer via the further contact layer. The connection layer can also be formed as a through-via or a plurality of through-vias throughout the carrier. In general, the carrier can be formed such that the second semiconductor layer of the semiconductor body is externally electrically contactable via the carrier.

The component may have a shielding structure in the direct vicinity of the electrical contact layer. The shielding structure is configured in particular to prevent the electromagnetic radiation generated by the active layer from impinging on the contact layer. In particular, the shielding structure is formed with regard to its geometry and/or material such that it has a reflective or scattering or waveguiding effect for the electromagnetic radiation emitted by the active layer. The shielding structure is located in the direct vicinity of the contact layer if the shielding structure adjoins the contact layer or if a contiguous area accounts for in particular at most 30%, especially at most 20%, for example, at most 10% or at most 5% of the first and/or of the second main surface of the semiconductor body, wherein, in a plan view, the shielding structure and, where appropriate, a region arranged in the lateral direction between the shielding structure and the contact layer are covered, in particular completely, by the continuous surface.

The shielding structure can be formed in the semiconductor body, for example, in the form of openings or recesses. The shielding structure and the contact layer are arranged in particular relative to one another such that the radiation emitted by the active layer or a main part thereof impinges at first on the shielding structure before it can reach the contact layer on the first main surface of the semiconductor body.

The component may have a carrier and a semiconductor body arranged on the carrier. The semiconductor body has a first main surface remote from the carrier and a second main surface facing the carrier. The semiconductor body has a first semiconductor layer on the side of the first main surface and a second semiconductor layer on the side of the second main surface, wherein an active layer of the semiconductor body is arranged between the first and the second semiconductor layers. During operation of the component, the active layer is configured to generate an electromagnetic radiation, which can be coupled out from the component for instance through the first main surface of the semiconductor body. Furthermore, the component has an electrical contact layer on the first main surface, wherein the electrical contact layer is configured to electrically contact the first semiconductor layer. In a plan view of the carrier, the electrical contact layer covers the first main surface in places. The component comprises a shielding structure in the direct vicinity of the electrical contact layer, wherein the shielding structure is configured to prevent the electromagnetic radiation generated by the active layer from impinging onto the contact layer.

Such a component has a contact layer on the radiation exit side, wherein the contact layer usually has a negative effect with regard to the efficiency of the component due to its radiation-absorbing material. So far, this disadvantage is reduced in that, as far as possible, no light is generated in the surrounding of the contact layer or in that the radiation-absorbing contact layer is designed to be as small or as reflective as possible. However, there are restrictions in the choice of materials and in the choice of geometries for the contact layer. Moreover, it cannot be ruled out that light may propagate for instance up to absorptive surfaces of the contact layer and be absorbed by the contact layer.

By forming a shielding structure in the direct vicinity of the electrical contact layer on the radiation exit surface, it can be achieved that the radiation emitted by the active layer does not reach or hardly reaches the contact layer on the radiation exit side of the component and thus is not absorbed or is hardly absorbed by the contact layer. By the shielding structure, the radiation propagating towards the contact layer can be reflected in a loss-free manner or can be directly coupled out from the semiconductor body or from the component due to an increased scattering rate at the shielding structure. Hence, an overall increased light output can be achieved with the shielding structure through reduced absorption.

The shielding structure may have at least one opening. The opening can extend in the vertical direction from the first main surface into the first semiconductor layer. In particular, the opening is formed as a blind hole in the semiconductor body. In this case, the opening can extend from the first main surface throughout the first semiconductor layer and the active layer. It is also possible for the opening to extend from the first main surface through the active layer as far as the second main surface of the semiconductor body. This means that the opening can be formed throughout the semiconductor body in the vertical direction.

Such an opening has a lateral cross section whose lateral extent is in particular in the nanometer range, for instance in the range of the wavelength of the emitted electromagnetic radiation, for example, 300 nm to 800 nm. It is also possible for the opening to have a cross section having a lateral extent of about 1 µm to 10 µm, preferably 1 µm to 7 µm, for example, 1 µm to 5 µm. The opening can have an elongated cross-section, for example, a strip-shaped cross section, whose lateral width is for instance 300 nm to 800 nm and whose lateral length is for instance 1 µm to 10 µm. The lateral cross section of the opening can also have other shapes, for example, a circular, elliptical or polygonal shape.

It is also possible for the opening to have cross sections which vary, for example, with regard to their shape or size along the vertical direction.

The shielding structure may have a plurality of openings, wherein the openings extend into the semiconductor body and are arranged such that the contact layer, in a plan view of the carrier, is surrounded by the openings at least partially or completely. These openings can have any shapes. Each of the openings can also have a lateral cross section whose lateral extent is in the range of the wavelengths of the emitted radiation or in the micrometer range. The contact layer can be arranged on the edge or in the middle of, or centrally on the radiation exit surface or on the first main surface of the semiconductor body.

The openings may be formed with regard to their geometry and/or their relative mutual arrangement such that the emitted electromagnetic radiation is prevented from passing through the shielding structure. For example, the shielding structure has a periodic, in particular symmetrical pattern at least in places. The shielding structure is formed preferably in the shape of a photonic lattice. In this case, with regard to the emitted electromagnetic radiation, the shielding structure can act similar to a photonic crystal, for example, in a wave-guiding and especially in a reflective manner at the same time. In this case, the geometry of the openings and their relative mutual arrangement can be chosen such that the shielding structure forms an energetically forbidden zone for photons in the semiconductor body such that the shielding structure, as a whole, acts as a photonic lattice that prevents passage of the electromagnetic radiation emitted by the active layer. The openings can be arranged relative to one another such that distances between the closest neighboring openings are in the range of the wavelength of the emitted radiation, for example, about 300 nm to 800 nm. In particular, the distances are smaller than a peak wavelength of the electromagnetic radiation emitted by the active layer.

The opening may have a decreasing lateral cross-section with increasing distance from the first main surface. In particular, the shielding structure is formed by such an opening and a reflecting layer, wherein the reflecting layer is arranged for instance on a side wall of the opening. The opening can be conical, truncated cone-shaped, pyramid-shaped or truncated pyramid-shaped. At the first main surface, the opening can have a lateral cross section having a lateral extent being comparable to a lateral extent of the contact layer. For example, the lateral extent of the contact layer and the lateral extent of the opening at the first main surface differ from each other by at most 30%, in particular by at most 20% or 10%. In particular, the lateral extents of the contact layer and of the opening are matched to one another such that the radiation emitted by the active layer and propagates towards the contact layer is reflected back by the reflecting layer of the shielding structure. In variation from this, it is also possible for the opening to have a constant or an increasing lateral cross section with increasing distance from the first main surface.

The semiconductor body may have a side surface having a step, wherein the step comprises a first surface extending in the lateral direction and a second surface extending in the vertical direction. The contact layer is arranged in particular on the first surface, wherein the shielding structure has a reflecting layer on the second surface. In particular in this case, the first main surface of the semiconductor body likewise has the step, wherein the contact layer and the reflecting layer of the shielding structure are arranged on different partial surfaces of the first main surface. For example, each of the first surface and the second surface of the step is formed by a surface of the first semiconductor layer. The reflecting layer can extend in the vertical direction from the first surface of the step to the radiation exit surface of the component.

The shielding structure may be formed by a contact deep-laid in the semiconductor body and provided to electrically contact the first semiconductor layer. The deep-laid contact can have a main body adjoining the contact layer on the first main surface. The main body can be completely embedded in the first semiconductor layer. Preferably, the side faces of the main body are coated with a reflecting layer. The main body can have a partial region free of the reflecting layer and embedded in the first semiconductor layer. In particular, an optimum electrical connection between the first semiconductor layer and the main body or the contact layer can be formed by this partial region free of the reflecting layer. It is also possible for the reflecting layer to be electrically conductive so that the main body likewise electrically conductively connects to the first semiconductor layer at the regions of the reflecting layer.

The component has an electrically conductive mirror layer arranged in the vertical direction between the semiconductor body and the carrier. In a plan view of the carrier from the first main surface, in the lateral direction, the shielding structure is preferably arranged between the contact layer and the mirror layer. The shielding structure is configured such that, during operation of the component, radiation generated by the active layer is prevented from passing through the shielding structure to the contact layer. A current flow between the contact layer and the mirror layer, for example, throughout the shielding structure can be uninterrupted. For this purpose, at least in the first semiconductor layer, the openings can be formed with regard to their geometry and/or their relative mutual arrangement such that electric charge carriers can be injected through the plurality of openings, while photons, in particular having the peak wavelength of the radiation emitted by the active layer, are reflected by the shielding structure or scattered in the direction of the radiation exit area of the component.

The mirror layer is preferably electrically conductive and forms, for example, a main part of the second contact of the component. In this case, the mirror layer can cover for instance at least 50%, for example, at least 70% or at least 90% of a total area of the active layer. By arranging the shielding structure in the lateral direction between the mirror layer and the contact layer, a main part of the electromagnetic radiation is generated in a region of the active layer which is in particular free of an overlap with the contact layer. This means that comparatively less electromagnetic radiation is generated in a region of the active layer covered by the contact layer and, as a result, less emitted radiation is absorbed by the contact layer in total so that overall efficiency of the component is increased. In this case, the mirror layer and the contact layer are preferably arranged relative to one another such that, in a plan view of the carrier, they are free of an overlap.

The component may be formed as a sapphire semiconductor chip having a semiconductor body arranged on a sapphire substrate and/or deposited epitaxially on a sapphire substrate by a coating method.

Further advantages, preferred configurations and further developments of the component will become apparent from the examples explained below in conjunction with FIGS. 1A to 5.

Identical, equivalent or equivalently acting elements are indicated with the same reference numerals in the figures. The figures are schematic illustrations and thus not necessarily true to scale. Comparatively small elements and particularly layer thicknesses can rather be illustrated exaggeratedly large for the purpose of better clarification.

Figure 1A:
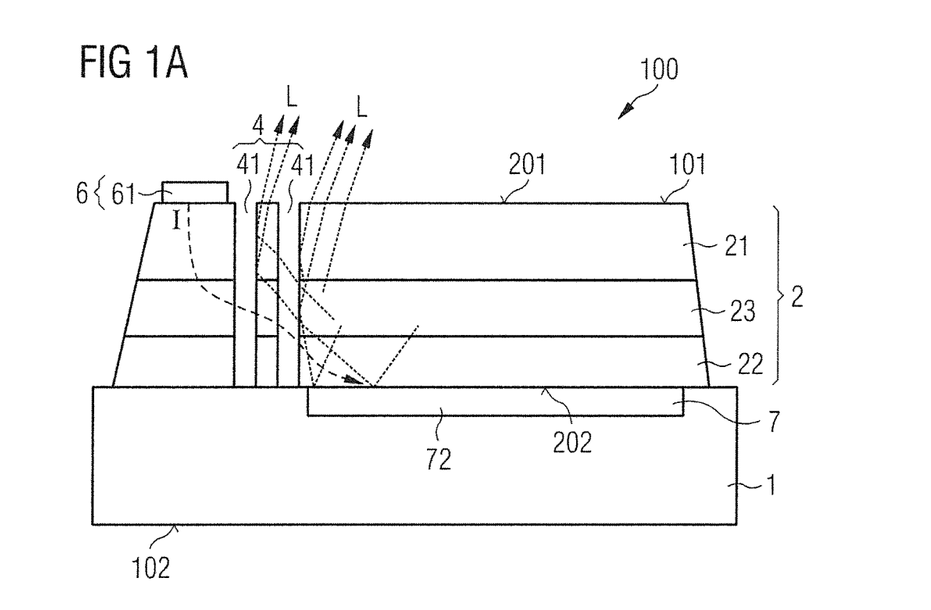
FIGS. 1A-1C, 2A-2B, 3A-3B and 4 to 5 show different examples of a component in schematic sectional views.

An example of a component 100 is illustrated schematically in FIG. 1A. The component 100 has a carrier 1 and a semiconductor body 2 arranged on the carrier. The semiconductor body 2 has a first semiconductor layer 21 remote from the carrier 1 and a second semiconductor layer 22 facing the carrier 1. An active layer 23 that generates an electromagnetic radiation L is arranged between the first semiconductor layer 21 and the second the semiconductor layer 22.

The semiconductor body 2 can be formed from an III-V compound semiconductor material. The III-V compound semiconductor material has an element from the third main group such as B, Al, Ga, In, and an element from the fifth main group such as N, P, As. In particular, the term "III-V compound semiconductor material" comprises the group of binary, ternary or quaternary compounds that comprise at least one element from the third main group and at least one element from the fifth main group, for example, nitride and phosphide compound semiconductors. Such a binary, ternary or quaternary compound can additionally contain, for example, one or more dopants and additional constituents. The semiconductor body 2 may also be formed from a II-VI compound semiconductor material.

For example, the first semiconductor layer 21 is n-conductive and the second semiconductor layer 22 is p-conductive, or vice versa. The semiconductor body 2 has a first main surface 201 remote from the carrier 1 and a second main surface 202 facing the carrier 1. The first main surface 201 can be formed by a surface of the first semiconductor layer 21 and the second main surface 202 can be formed by a surface of the second semiconductor layer 22. It is also possible for the first and second main surfaces of the semiconductor body 2 to be formed by surfaces of further semiconductor layers of the semiconductor body 2. In particular, the main surfaces delimit the semiconductor body 2 in the vertical direction. This means that for instance only semiconductor layers are arranged between the first main surface 201 and the second main surface 202.

In particular, the first main surface 201 is formed as a radiation passage area of the component 100. The component 100 has a front side 101 that serves in particular as a radiation exit surface of the component 100. This means that the radiation L emitted by the active layer may pass through the first main surface 201 and be coupled out from the component 100 at the front side 101. In this case, the first main surface 201 and the front side 101 can be the same surface. In FIG. 1A, the first main surface 201 and the front side 101 are flat. In contrast thereto, it is also possible for the first main surface 201 or the front side 101, which is formed as a radiation exit surface, to be structured for increasing the coupling-out efficiency.

The component 100 has a contact layer 61 on its front side 101 or on the first main surface 201 of the semiconductor body 2, wherein the contact layer is configured especially to electrically contact the first semiconductor layer 21. In particular, the contact layer 61 directly adjoins the first semiconductor layer 21. Via the contact layer 61, the first semiconductor layer 21 is electrically connectable for instance to an external voltage source.

To electrically contact the second semiconductor layer 22, the component 100 comprises an electrically conductive layer 72 on the side of the second main surface 202. In particular, the electrically conductive layer 72 is formed as a mirror layer. Preferably, the mirror layer 72 comprises a metal such as aluminum, rhodium, palladium, silver or gold. For example, the mirror layer reflects at least 60%, preferably at least 80%, particularly preferably at least 90% of a proportion of the spectrum of the radiation emitted by the active layer 23 impinging on the mirror layer during operation of the component.

The contact layer 61 can be part of a first contact 6 (not shown here), wherein the first contact 6 can have for instance a current spreading layer that is electrically conductive and preferably radiation-transmissive at the same time and is made for instance from an electrically conductive and radiation-transmissive oxide. The current spreading layer can cover the first main face 201 to a large extent or completely. The electrically conductive layer 72 can be formed as part of a second contact 7 (not shown here), wherein the second contact 7 can have a current spreading layer covering a major part of the second main face 202 or preferably covering the entire second main surface 202. The current spreading layer of the second contact 7 can be a metal layer. During operation of the component 100, the first contact 6 and the second contact 7 electrically connect for instance to an external voltage source. The carrier 1 can be formed to be electrically conductive.

Alternatively, it is also possible for the carrier 1 to be formed from an electrically insulating material. In this case, the second contact 7 can have a partial region exposed for instance on the carrier 1 and is thus externally electrically contactable. The partial region can be part of the mirror layer 72 or of the current spreading layer of the second contact 7, the part being exposed for instance to the side of the carrier 1 or to the side of the semiconductor body 2 on the carrier 1. This partial region can also be a through-via which extends from a rear side 101 of the component through the carrier 1 to the mirror layer 72. The second contact 7 can also have a plurality of such through-vias. The component 100 can thus be connected to an external voltage source via the front side 101 and via the rear side 102.

The component 100 has a shielding structure 4 in the direct vicinity of the contact layer 61. The shielding structure 4 is configured in particular to prevent the electromagnetic radiation L generated by the active layer 23 from impinging on the contact layer 61 such that as little radiation as possible is absorbed by the contact layer 61. The shielding structure 4 is configured in particular such that the radiation impinging on the shielding structure 4 is reflected or scattered in particular to regions of the radiation exit surface of the component 101 which are void of the contact layer 61. It is also possible for the semiconductor body 2 to be arranged for instance on a radiation-transmissive substrate, for example, on a sapphire substrate. In particular, the carrier 1 can be a sapphire substrate. It is also possible for the component 100 to have, in addition to the carrier 1, a sapphire substrate on the side of the first main surface 201. To form the shielding structure 4, the sapphire substrate can be partially removed or structured.

In FIG. 1A, the shielding structure 4 has at least one opening 41. In a plan view of the carrier 1, the opening 41 is arranged laterally between the contact layer 61 and the mirror layer 72. The shielding structure 4 can have a plurality of such openings 41. In a plan view of the carrier 1, the entire shielding structure 4 can be arranged laterally between the contact layer 61 and the mirror layer 72. Here, the mirror layer 72 can cover a large part, for example, at least 60%, at least 80% or at least 90% of the second main surface 202 or of the active layer 23. If an electromagnetic radiation is emitted by the active layer 23, impinges on the mirror layer 72 and propagates towards the contact layer 61, the electromagnetic radiation may be redirected, in particular reflected in a loss-free manner, by the shielding structure 4 towards the radiation exit area of the component 100 and can be coupled out at the radiation exit surface of the component 100.

According to FIG. 1A, in a plan view of the carrier 1, the contact layer 61 and the mirror layer 72 are free from an overlap. If the mirror layer 72 covers a large part of the active layer 23 and the mirror layer 72 is electrically conductive, a large part of the radiation will be generated directly above the mirror layer 72. The radiation L can be kept away from the contact layer 61 on account of the shielding structure 4 and thus can be coupled out from the component 100 in a loss-free or almost loss-free manner. Here, the carrier 1 can be made from an electrically insulating material such that regions of the active layer 23 situated directly below the contact layer 61 and thus do not have any overlap with the mirror layer 72, are not promoted to generate electromagnetic radiation.

FIG. 1A schematically shows the shielding structure 4 being configured such that, in operation of the component 100, a passage of the radiation L emitted by the active layer through the shielding structure 4 in particular to the contact layer 61 is prevented, whereas a current flow I from the contact layer 61 through the shielding structure 4 to the mirror layer 72 may remain uninterrupted. This can be achieved, for example, by a targeted structuring with regard to the geometry or the dimension of the openings 41 and/or by a suitable relative mutual arrangement of the openings 41. In this case, the semiconductor body 2 having the semiconductor layers 21 and 22 and the active layer 23 remains in particular contiguous so that an uninterrupted current flow is obtained between the contact layer 61 and the mirror layer 72.

In FIG. 1A, the opening 41 or the plurality of openings 41 extends/extend from the first main surface 201 through the first semiconductor layer 21, the active layer 23 and the second semiconductor layer 22 to the second main surface 202 of the semiconductor body 2. To form the opening 41 or the plurality of openings 41, the semiconductor body 2 can be microstructured, for example, etched. In FIG. 1A, the contact layer 61 is arranged on the edge side on the front side 101 of the component. Deviating from that, it is also possible for the contact layer 61 to be arranged for instance centrally on the front side 101. Even in a centrally arranged contact layer 61, the mirror layer 72 and the shielding structure 4 can be formed such that, in a plan view of the carrier 1 from the front side 101, the shielding structure 4 is arranged in lateral directions between the contact layer 61 and the mirror layer 72, wherein the contact layer 61 and the mirror layer 72, in plan view, are for instance free of an overlap.

Figure 1B:
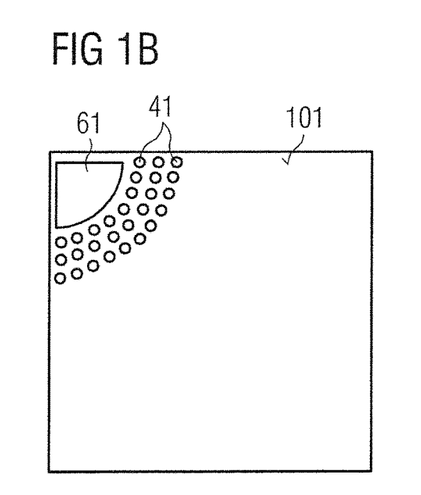
Figure 1C:
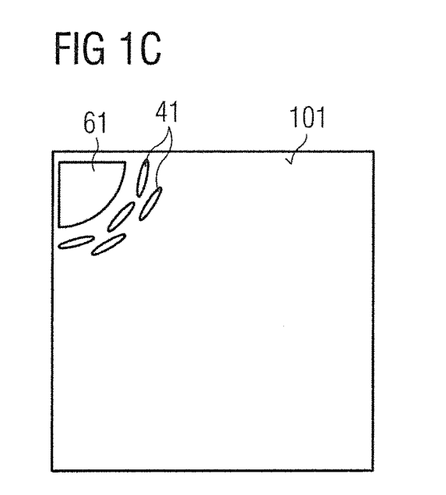

FIGS. 1B and 1C show different examples for a component 100 having a shielding structure 4 in plan view. The contact layer 61 is arranged on the edge side on the front side 101 of the component 100. The shielding structure 4 has a plurality of openings 41. The openings 41 are arranged such that the contact layer 61 is surrounded by the openings 41 at least in places. In particular, the openings 41 form a periodic, for instance symmetrical pattern, which in particular prevents a passage of the emitted radiation L through the shielding structure 4 to the contact layer 61. The cross sections of the openings 41 and their distance from one another can be chosen such that the shielding structure 4 as a whole acts as a photonic lattice. In FIGS. 1B and 1C, the contact layer 61 can be surrounded in places by a plurality of rows of periodically arranged openings 41. If the contact layer 61 is not arranged on the edge side, the contact layer 61 can be surrounded also completely, i.e., in all lateral directions, by the shielding structure 4, in particular by the openings 41.

In FIG. 1B, the openings 41 each have a substantially circular cross section. In contrast thereto, the openings 41 may each have an elongated cross section as shown in FIG. 1C. Lateral interspaces between adjacent openings 41 of one row can be covered by openings of neighboring rows in a simplified manner so that the contact layer 61 is shielded in an effective manner from the radiation generated during operation of the component by the openings 41 having elongated cross sections.

Figure 2A:
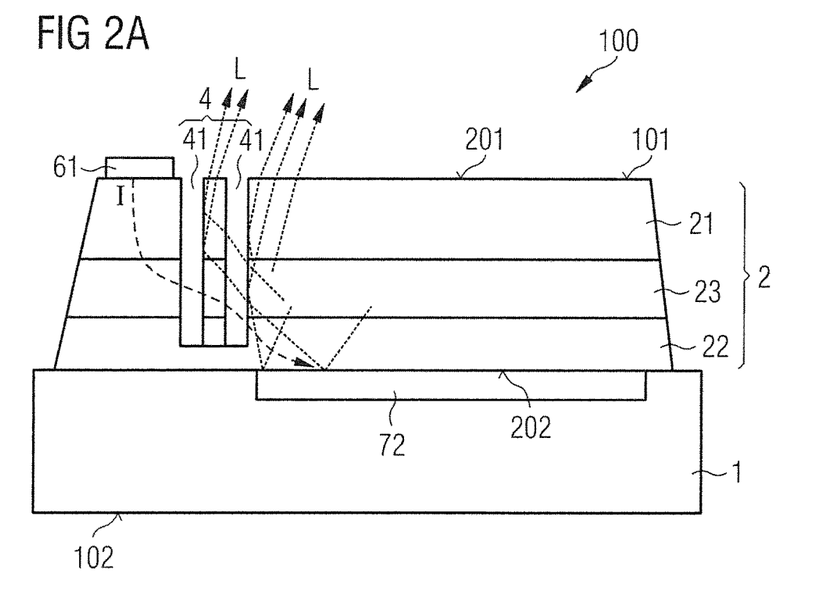
Figure 2B:
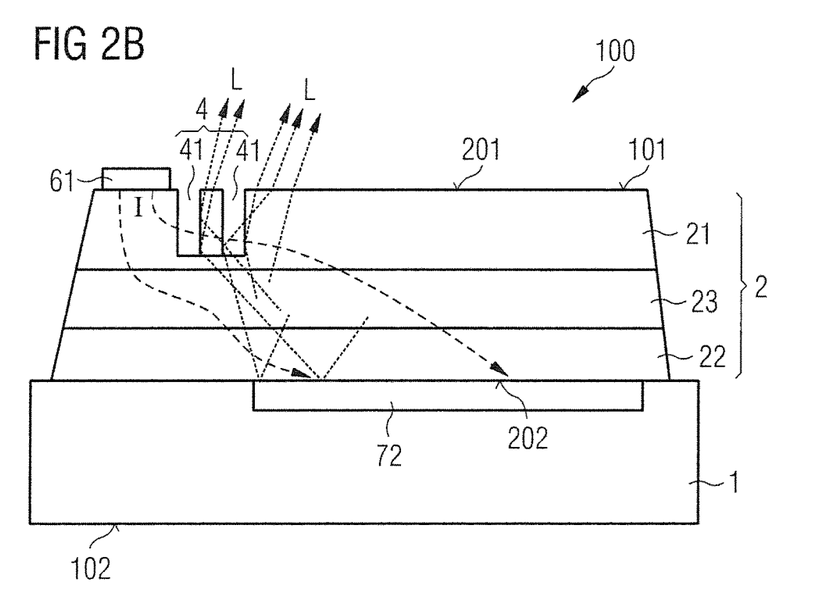

Each of FIGS. 2A and 2B shows a further example of a component in a schematic sectional view. These examples correspond substantially to the example of a component 100 as shown in FIG. 1A. In contrast thereto, the opening 41 or the plurality of openings 41 in FIG. 2A extends/extend in the vertical direction from the first main surface 201 through the active layer 23 into the second semiconductor layer 22. The opening 41 or the openings 41 thus has/have the shape of a blind hole in the semiconductor body 2. In contrast to FIG. 2A, the openings 41 as illustrated in FIG. 2B extend only from the first main surface 201 into the first semiconductor layer 21. Such openings 41 therefore do not extend throughout the active layer 23 and can be produced in a comparatively simplified manner. Also, a continuous current flow I between the contact layer 61 and the mirror layer 72 is promoted.

Figure 3A:
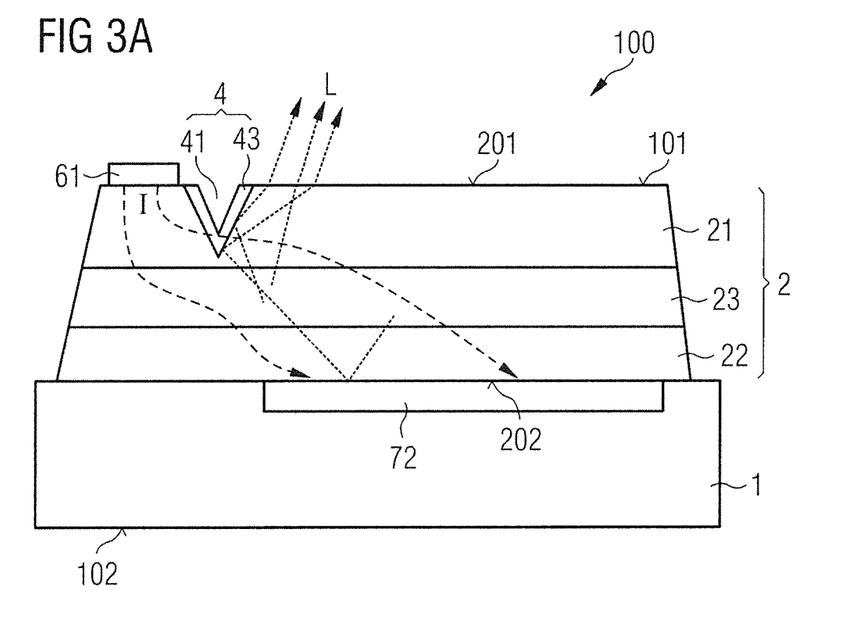
Figure 3B:
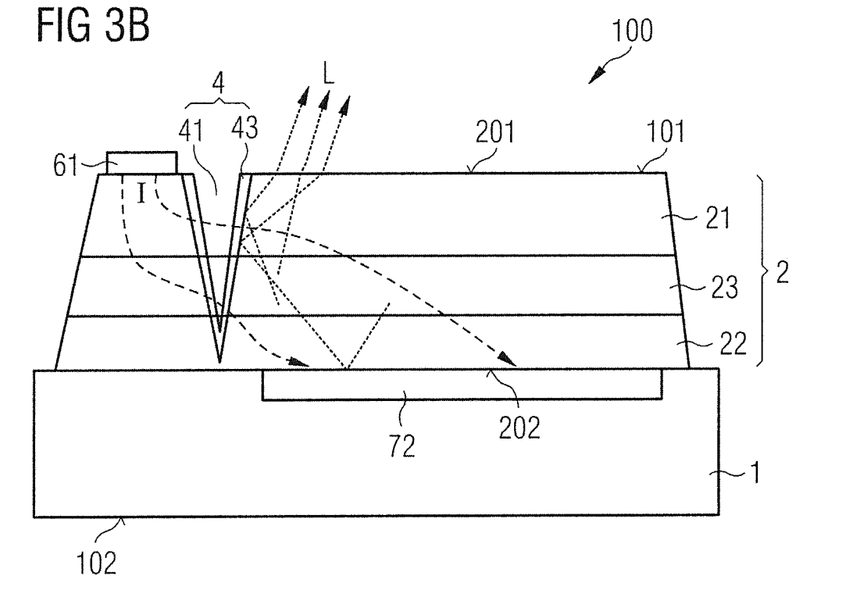

FIGS. 3A and 3B show further examples of a component 100 in sectional view. These examples correspond substantially to the example for a component as illustrated in FIG. 1A. In contrast thereto, the opening 41 is formed in the semiconductor body 2 such that the opening 41 has a decreasing lateral cross section with increasing distance from the first main surface. In FIGS. 3A and 3B, V-shaped cross sections of the openings are shown. The opening 41 has a side wall on which a reflecting layer 43 is arranged. The cross section of the opening 41 of the shielding structure 4 is formed for instance to be that large that the radiation propagating towards the contact layer 61 is reflected back by the reflecting layer 43 on the side wall of the opening 41. In FIG. 3A, the opening 41 is formed only in the first semiconductor layer 21. In contrast thereto, in the vertical direction, the opening 41 can extend throughout the active layer 23. Where necessary, an electrically insulating layer can be arranged between the semiconductor body 2 and the reflecting layer 43. As shown in FIG. 3B, the opening 41 can extend through the active layer into the second semiconductor layer 22. The opening 41 can also be formed such that it extends through the entire semiconductor body 2. The shielding structure 4 can comprise a single opening 41. Here, the opening 41 can be formed such that, in a lateral direction, the contact layer 61 is surrounded in particular to a large extent or completely by the opening 41. Alternatively, the shielding structure can have a plurality of such openings 41 that together surround the contact layer 61 partially or completely.

Figure 4:
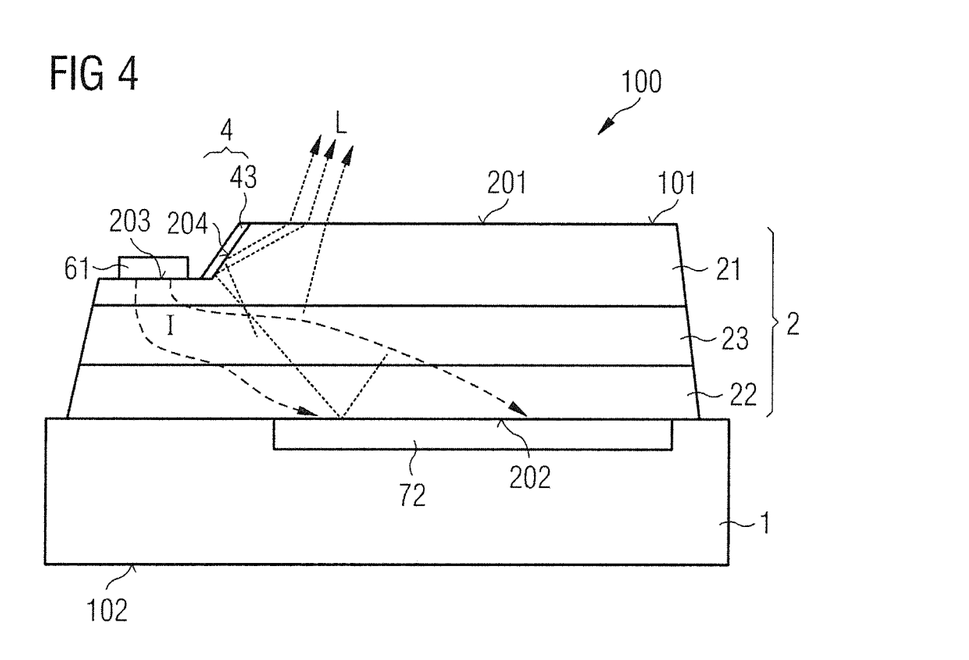

FIG. 4 shows a further example of a component in sectional view corresponding substantially to the example as shown in FIG. 3A. In contrast thereto, a side surface of the semiconductor body 2 has a step. The step has a first surface 203 extending in the lateral direction and a second surface 204 extending in the vertical direction. Here, the contact layer 61 is arranged on the first surface 203, wherein the first surface 203 is formed in particular by a surface of the first semiconductor layer 21. The reflecting layer 43 of the shielding structure 4 is arranged on the second surface 204.

The second surface 204 can also be formed by a surface of the first semiconductor layer 21. In other words, the step of the side surface of the semiconductor body 2 can be formed by surfaces of the first semiconductor layer 21. In this case, the second surface 204 is formed obliquely with respect to the first surface 203 of the step. Here, the first surface 203 of the step can run parallel to the second main surface 202. The reflecting layer 43 can extend along the vertical direction from the first surface 203 of the step to the front side 201 or to the radiation exit surface of the component. The step can be formed such that, in the direction of the mirror layer 72, the contact layer 61 is partially or completely surrounded by the reflecting layer 43.

Figure 5:
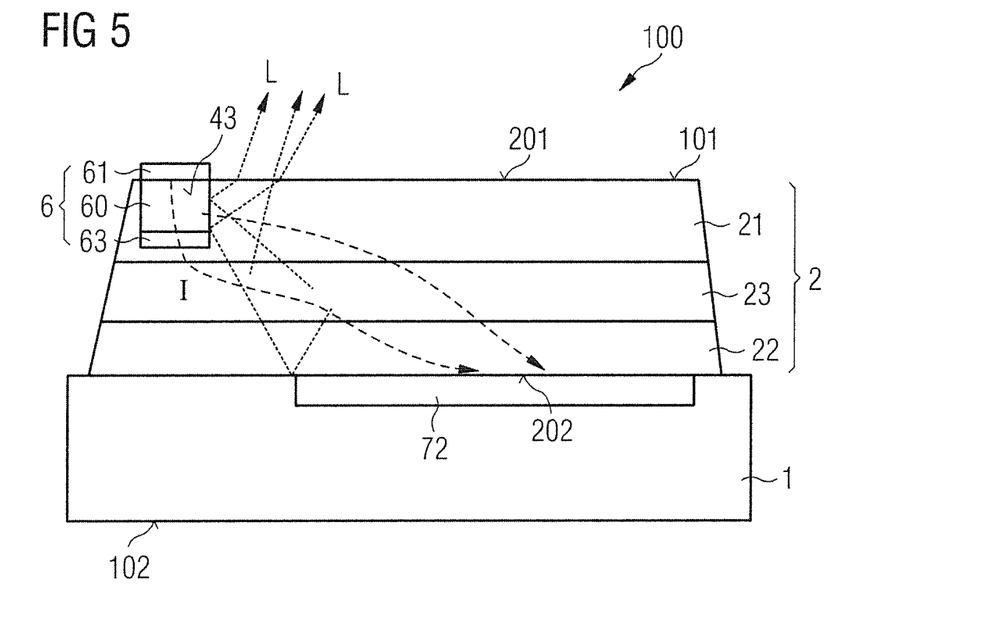

FIG. 5 shows a further example of a component in sectional view corresponding substantially to the example as shown in FIG. 3A. In contrast thereto, the shielding structure 4 is formed by a first contact 6 deep-laid in the semiconductor body. The deep-laid contact 6 has a main body 60 that in particular adjoins the contact layer 61. The main body 60 is coated with the reflecting layer 43. The main body 60 can be made from a metal. The first contact 6 has a deep-laid contact layer 63 completely embedded in the semiconductor body 2, for example, in the first semiconductor layer 21. The deep-laid contact layer 63 can be a region of the main body 60 free of the reflecting layer 43. In particular, the contact layer 61 can also be part of the main body 60 projecting beyond the first semiconductor layer 21 and is free of the reflecting layer 43. For example, the reflecting layer 43 is surrounded by the semiconductor body 2, in particular by the first semiconductor layer 21, in all lateral directions.

The radiation-reflecting layer 43 shown in FIGS. 3A to 3B to 5 can be formed from a highly reflective material. Preferably, the radiation-reflecting layer 43 has a metal such as aluminium, rhodium, palladium, silver or gold.

The opening 41 shown in FIGS. 3A and 3B and/or the second surface 204 shown in FIG. 4 can each be formed such that, in a plan view, the contact layer 61 is partially or completely surrounded by the opening 41 or the second surface 204. It is also possible for the shielding structure 4 shown in FIGS. 3A and 3B to have only a single opening 41 and for the shielding structure 4 shown in FIG. 4 to have a single step having the second surface 204.

In all examples, it is also possible for the shielding structure 4 to be formed not only in the direct vicinity of the contact layer 61 but over the entire radiation exit surface of the component. The component can also have a plurality of contact layers 61 on its radiation exit surface. Each of these contact layers 61 can be surrounded by the shielding structure 4 partially or completely so that the radiation propagating in the direction of the contact layers 61 is reflected or scattered towards the radiation exit surface.

By a shielding structure, a contact layer of a component being arranged on a radiation exit surface can be shielded from a radiation generated during operation of the component, wherein the shielding structure reflects or scatters the radiation impinging thereon in particular to regions of the radiation exit surface which are free of the contact layer so that the emitted radiation is coupled out from the component in a loss-free or almost loss-free manner, as a result of which the light output of the component is increased.

This application claims priority of DE 10 2015 111 493.3, the subject matter of which is incorporated herein.

Our components are not restricted to the examples by the description made with or without reference to the figures. This disclosure rather comprises any novel feature and any combination of features, including in particular any combination of features in the appended claims, even if the feature or combination is not itself explicitly indicated in the claims or examples.

The invention claimed is:

1. A component comprising a carrier, a mirror layer and a semiconductor body arranged on the carrier, wherein
the semiconductor body has a first main surface remote from the carrier and a second main surface facing the carrier, and the semiconductor body has a first semiconductor layer on the side of the first main surface and a second semiconductor layer on the side of the second main surface,
the semiconductor body has an active layer arranged between the first and the second semiconductor layers and configured to generate, during operation of the component, an electromagnetic radiation that can be coupled out from the component through the first main surface,
on the first main surface the component has an electrical contact layer configured to electrically contact the first semiconductor layer and in a plan view of the carrier covers the first main surface in places,
in direct vicinity of the electrical contact layer the component comprises a shielding structure configured to prevent the electromagnetic radiation generated by the active layer from impinging onto the contact layer,
the mirror layer is arranged in a vertical direction between the semiconductor body and the carrier, in a plan view of the carrier from the first main surface, the shielding structure is arranged in a lateral direction between the electrical contact layer and the mirror layer, and in a plan view of the carrier, the mirror layer and the electrical contact layer are free of an overlap.

2. The component according to claim 1, wherein the shielding structure is formed with regard to its geometry and/or material such that it has a reflective or scattering effect for the electromagnetic radiation emitted by the active layer.

3. The component according to claim 1, wherein the shielding structure has at least one opening extending in a vertical direction from the first main surface into the first semiconductor layer.

4. The component according to claim 3, wherein the opening extends from the first main surface through the first semiconductor layer and the active layer.

5. The component according to claim 3, wherein the opening extends from the first main surface through the active layer as far as the second main surface.

6. The component according to claim 3, wherein the opening has a decreasing lateral cross-section with increasing distance from the first main surface and the shielding structure has a reflecting layer arranged on a side wall of the opening.

7. The component according to claim 1, wherein the shielding structure has a plurality of openings, and the openings extend into the semiconductor body and in a plan view of the carrier the contact layer is surrounded by the openings at least in places.

8. The component according to claim 7, wherein
at least in the first semiconductor layer, the openings are formed with regard to their geometry and/or their relative mutual arrangement such that, during operation of the component, the radiation generated by the active layer is prevented from passing through the shielding structure to the contact layer, whereas a current flow between the contact layer and the mirror layer is uninterrupted.

9. The component according to claim 7, wherein the openings are formed with regard to their geometry and/or their relative mutual arrangement such that the shielding structure has a periodic pattern at least in places and as a whole acts as a photonic lattice preventing a passage of the emitted electromagnetic radiation.

10. The component according to claim 1, wherein the semiconductor body has a side surface having a step, the step comprises a first surface extending in a lateral direction and a second surface extending in a vertical direction, and the contact layer is arranged on the first surface and the shielding structure has a reflecting layer on the second surface.

11. The component according to claim 10, wherein each of the first surface and the second surface is formed by a surface of the first semiconductor layer and the reflecting layer extends in a vertical direction from the first surface of the step to the first main surface of the semiconductor body.

12. The component according to claim 1, wherein the shielding structure is formed by a contact deep-laid in the semiconductor body,
the deep-laid contact has a main body adjoining the contact layer at the first main surface and is embedded in the first semiconductor layer, and
side surfaces of the main body are coated with a reflecting layer.

13. The component according to claim 1, wherein the mirror layer is electrically conductive and formed as a further contact or at least as part of a further contact, and the further contact is configured to electrically contact the second semiconductor layer.

14. The component according to claim 1, wherein
the shielding structure has a plurality of openings extending in a vertical direction from the first main surface through the first semiconductor layer and the active layer,
in a plan view of the carrier, the electrical contact layer is surrounded in places by the openings, and
the openings are formed with regard to their geometry and/or their relative mutual arrangement such that the shielding structure has a periodic pattern at least in places and as a whole acts as a photonic lattice preventing a passage of the emitted electromagnetic radiation.

15. The component according to claim 1, wherein
the semiconductor body has a side surface having a step, said step comprising a first surface extending in a lateral direction and a second surface extending in a vertical direction,
each of the first surface and the second surface is formed by surfaces of the first semiconductor layer,
the electrical contact layer is arranged on the first surface and the shielding structure has a reflecting layer on the second surface, and
the reflecting layer extends in a vertical direction from the first surface of the step to the first main surface of the semiconductor body.

16. A component comprising a carrier, a semiconductor body arranged on the carrier and a mirror layer, wherein
the semiconductor body has a first main surface remote from the carrier and a second main surface facing the carrier, and the semiconductor body has a first semiconductor layer on the side of the first main surface and a second semiconductor layer on the side of the second main surface,
the semiconductor body has an active layer arranged between the first and the second semiconductor layers and is configured to generate, during operation of the component, an electromagnetic radiation that can be coupled out from the component through the first main surface,
on the first main surface the component has an electrical contact layer configured to electrically contact the first semiconductor layer and in a plan view of the carrier covers the first main surface in places,
in a direct vicinity of the electrical contact layer the component comprises a shielding structure configured to prevent the electromagnetic radiation generated by the active layer from impinging onto the contact layer,
the mirror layer is arranged in a vertical direction between the semiconductor body and the carrier, and in a plan view of the carrier from the first main surface, the shielding structure is arranged in a lateral direction between the electrical contact layer and the mirror layer,
in a plan view of the carrier, the mirror layer and the electrical contact layer are free of an overlap, and
the entire shielding structure is arranged laterally between the electrical contact layer and the mirror layer.

17. A component comprising a carrier, a semiconductor body arranged on the carrier and a mirror layer, wherein
the semiconductor body has a first main surface remote from the carrier and a second main surface facing the carrier, and the semiconductor body has a first semiconductor layer on the side of the first main surface and a second semiconductor layer on the side of the second main surface,
the semiconductor body has an active layer arranged between the first and the second semiconductor layers and is configured to generate, during operation of the component, an electromagnetic radiation that can be coupled out from the component through the first main surface,
on the first main surface the component has an electrical contact layer configured to electrically contact the first semiconductor layer and in a plan view of the carrier covers the first main surface in places,
in a direct vicinity of the electrical contact layer the component comprises a shielding structure configured to prevent the electromagnetic radiation generated by the active layer from impinging onto the contact layer,
the mirror layer is arranged in a vertical direction between the semiconductor body and the carrier, and in a plan view of the carrier from the first main surface, the shielding structure is arranged in a lateral direction between the electrical contact layer and the mirror layer,
in a plan view of the carrier, the mirror layer and the electrical contact layer are free of an overlap, and
the shielding structure has a plurality of openings having elongated cross sections, and the electrical contact layer is surrounded in places by a plurality of rows of periodically arranged openings such that lateral interspaces between adjacent openings of one row are covered by openings of one neighboring row.

* * * * *